United States Patent
Park et al.

(10) Patent No.: US 6,628,155 B2
(45) Date of Patent: Sep. 30, 2003

(54) INTERNAL CLOCK GENERATING CIRCUIT OF SEMICONDUCTOR MEMORY DEVICE AND METHOD THEREOF

(75) Inventors: Jung-Woo Park, Seoul (KR); Uk-Rae Cho, Suwon (KR); Nam-Seog Kim, Seoul (KR)

(73) Assignee: Samsung Electronics, Co., Ltd, Suwon (KR)

( * ) Notice: Subject to any disclaimer, the term of this patent is extended or adjusted under 35 U.S.C. 154(b) by 0 days.

(21) Appl. No.: 10/072,487

(22) Filed: Feb. 7, 2002

(65) Prior Publication Data

US 2003/0016063 A1 Jan. 23, 2003

(30) Foreign Application Priority Data

Jul. 18, 2001  (KR) ..................................... 2001-0043049

(51) Int. Cl.[7] ................................................. H03L 7/06
(52) U.S. Cl. ....................................... 327/158; 327/161
(58) Field of Search ................................ 327/153, 158, 327/263, 265, 266, 269, 270, 271, 274, 276, 277, 281, 278, 299, 284, 161; 331/11, 45; 375/375, 376

(56) References Cited

U.S. PATENT DOCUMENTS

| 6,118,319 | A | * | 9/2000 | Yamada et al. | .............. | 327/291 |
| 6,225,843 | B1 | * | 5/2001 | Taniguchi et al. | .......... | 327/158 |
| 6,229,363 | B1 | * | 5/2001 | Eto et al. | .................... | 327/158 |
| 6,396,322 | B1 | * | 5/2002 | Kim et al. | ................... | 327/158 |

* cited by examiner

*Primary Examiner*—Tuan T. Lam
(74) *Attorney, Agent, or Firm*—F. Chau & Associates, LLP

(57) ABSTRACT

An internal clock generating circuit and method for generating an internal clock phase-synchronized to an input clock with minimum delay and at high speed is disclosed. An internal clock generating circuit comprises a first delay control circuit for generating a first clock having the time delay of up to T/2 (where T is a cycle of an input clock) from the input clock and for generating a first variable delay control signal; and a second delay control circuit for generating a second clock in response to the first variable delay control signal, the second clock having the time delay of greater than T/2 from the input clock at an initial state and having the time delay of about T from the input clock in a phase-locked state.

15 Claims, 4 Drawing Sheets

INTERNAL CLOCK GENERATING CIRCUIT OF SEMICONDUCTOR MEMORY DEVICE AND METHOD THEREOF

BACKGROUND OF THE INVENTION

1. Technical Field

The present invention relates to a semiconductor memory device, and more particularly, to an internal clock generating circuit and method for generating an internal clock which is phase synchronized to an input clock at high speed and with minimum delay.

2. Description of Related Art

In electronic systems having semiconductor memories, a central processing unit (CPU) typically functions as a master and the memory device (which is inter-connected to the CPU through a bus) functions as a slave. The master CPU controls data read/write operations and transmits addresses, commands, and timing information including a data sampling clock to the slave memory device.

For instance, when an external clock (that is aligned or centered to data) is transmitted to a slave through a bus, the slave generates an internal clock for sampling the data. The internal clock should be a data-centered clock synchronized to the external clock. Therefore, if an external clock is a data-aligned clock, the external clock needs to be delayed by an amount of time to generate a data-centered internal clock.

Therefore, a slave should sample an external data with an internal clock having a valid data window. However, as data rate/pin increases, the window for validly clocking data narrows. And, when a data path is slightly different from a clock path in a system, a skew between an external clock and the internal clock or data will be larger. A system using double data rate (DDR), which receives two pieces of data every clock cycle, has an even larger skew than a system having a single data rate (SDR).

Therefore, a slave requires a circuit for controlling a phase of an external clock according to a control signal and for generating an internal clock synchronized to the external clock to meet setup/hold requirements.

When an external clock is controlled by a data sampling internal clock generated through a simple delay line in an internal clock generating circuit, an extra time delay corresponding to an increase/decrease of a unit cycle is generated, thereby limiting performance of the circuit. An internal clock generating circuit generally includes a delay locked loop (DLL) to offset such limitation. One exemplary DLL is described in Japanese patent application laid open No. 11-316618, Nov. 16, 1999. In this reference, multiple DLLs are proposed, each DDL having a different layer structure from the other. The plurality of DDLs are combined to control the phase of external clocks and generate an internal clock having a predetermined amount of time delay.

Typically, because total time delay of a DLL corresponds to a half cycle, it is difficult to generate an internal clock that is synchronized to an external clock within a short amount of time.

FIGS. 1a and 1c are diagrams showing the time delay of an internal clock phase-synchronized to an input clock phase at an initial state and in a phase-locked state, generated by a conventional internal clock generating circuit, respectively. FIGS. 1b and 1d are diagrams showing a phase detector for detecting the time delay of FIGS. 1a and 1c, respectively.

In FIG. 1a, a clock (1A) is an input clock (e.g., an external clock), and a clock (1B) is an internal clock, in which the input clock passes a variable delay line of a DLL in an internal clock generating circuit to generate the internal clock. When the two clocks are applied to a phase detector D1 having a D-flip flop of FIG. 1b during an initial state of the circuit, the phase detector D1 latches the two clocks and outputs a low logic value "0" to an output line (OUT1) through an output terminal (Q). The logic value "0" is a signal for increasing a time delay of the variable delay line such that a phase of the clock (1B) is gradually shifted to the rear of a time axis. In other words, the phase delay between the clocks (1A and 1B) increases during the logic value "0". When the phase of the clock (1B) becomes the phase of a clock (ID) shown in FIG. 1c, i.e., the phase of the clock (1B) is delayed by a half cycle (T/2) of an input cycle after a continuous increase in the phase delay of the clock (1B), the phase detector D1 outputs a high logic value "1" to an output line (OUT1) through an output terminal (Q) as shown in FIG. 1d. The logic value "1" is a signal for reducing the time delay of the variable delay line.

Therefore, if the time delay of the internal clock (1B) is less than the half cycle (T/2) of the input clock, a logic value "0" is output to the output line (OUT 1). A logic value "1" is output to the output line (OUT1) after the time delay of the clock (1B) corresponds to the half cycle (T/2). When a DLL is locked (i.e., a normal state), as shown in FIG. 1c, the phase detector (D1) alternatively outputs a logic value "1" instead of a logic value "0".

As described above, a DLL attempts performing a phase locking operation to synchronize the internal clock at T/2 delay from the external clock (as shown in FIG. 1c). That is, the total time delay of the DLL having a variable delay line is T/2 instead of T. Thus, additional delay line is required to further delay the external clock to generate an internal clock phase-synchronized to an external clock.

Furthermore, because an internal clock phase-synchronized to an external clock is generated through a conventional DLL circuit requiring additional delay line, the time for generating the internal clock becomes longer. As a result, conventional internal clock generating circuits to achieve synchronization require additional delay and a longer time.

SUMMARY OF THE INVENTION

It is an object of the present invention to solve the aforementioned problem and provide an internal clock generating circuit and method for generating an internal clock synchronized to an external clock.

It is another object of the present invention to provide a circuit and method for generating an internal clock for accurately sampling data even if there is a skew between a clock and input data in a semiconductor memory device.

It is still another object of the present invention to provide an internal clock generating circuit and method for generating an internal clock synchronized to an external clock with a minimized delay stage.

It is further object of the present invention to provide an internal clock generating circuit and method for controlling the time delay of an internal clock by about one cycle of an input clock.

It is a still further object of the present invention to provide a circuit and method for simplifying the time delay line for delaying an input clock and for generating an internal clock synchronized to the input clock and a shifted clock of the input clock within a short period.

According to one aspect of the present invention, there is provided an internal clock generating circuit comprising a first delay control circuit for generating the first clock having a time delay of up to T/2 (where T is a cycle of an input clock) from the input clock and for generating a first variable delay control signal; and a second delay control circuit for generating a second clock in response to the first variable delay control signal, the second clock having the time delay of greater than T/2 from the input clock at an initial state and having the time delay of about T from the input clock in a phase-locked state.

In a preferred embodiment, the first delay control circuit comprises a first variable delay line for delaying a phase of the input clock to generate the first clock in response to the first variable delay control signal; a first phase comparison unit for comparing the first clock with the input clock to generate a first up/down counting control signal; and a first counter for counting the input clock to generate the first variable delay control signal in response to the first up/down counting control signal. The first variable delay line delays the phase of the input clock until the first clock has the time delay of up to T/2 from the input clock.

In a preferred embodiment, the second delay control circuit comprises a second variable delay line for delaying a phase of the input clock in response to a second variable delay control signal; a third variable delay line for delaying the output of the second variable delay line to generate the second clock in response to the first variable delay control signal; a second phase comparison unit for comparing the second clock with the input clock to generate a second up/down counting control signal; and a second counter for counting the input clock to generate the second variable delay control signal in response to the second up/down counting control signal. The second and third variable delay lines delay the input clock until the second clock has the time delay of greater than T/2 from the input clock at the initial state and the time delay of about T from the input clock in the phase-locked state.

According to another aspect of the present invention, there is provided a method for generating an internal clock. The method comprises the steps of generating the first internal clock having a time delay of up to T/2 (where T is a cycle of an input clock) from the input clock; and generating a second internal clock in response to the first internal clock, wherein the second internal clock has the time delay of greater than T/2 from the input clock at an initial state and has the time delay of about T from the input clock in a phase-locked state.

Advantageously, according to the present invention, an internal clock phase-synchronized to an input clock (e.g., an external clock) can be generated with minimum delay and at high speed. Therefore, data can be properly sampled in a semiconductor memory device even if there is a skew between an external clock and input data.

BRIEF DESCRIPTION OF THE DRAWINGS

Objects and aspects of the invention will become apparent from the following description of preferred embodiments with reference to the accompanying drawings in which.

DETAILED DESCRIPTION OF THE INVENTION

Figure 1A:
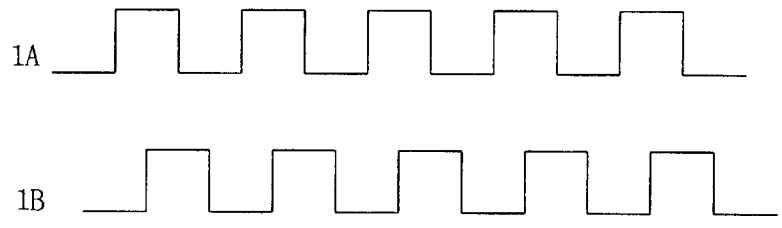
FIGS. 1*a* and 1*c* are diagrams showing the time delay of an internal clock phase-synchronized to an external clock phase at an initial state and in a phase-locked state, generated by a conventional internal clock generating circuit, respectively.
Figure 1B:
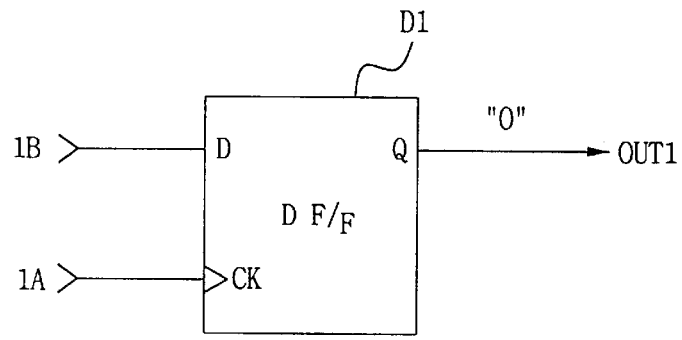
FIGS. 1*b* and 1*d* are diagrams showing a phase detector for detecting the time delay of FIGS. 1*a* and 1*c*, respectively.

The aforementioned objects, characteristic and advantages of the present invention will become more apparent from the detailed description of preferred embodiments with reference to the accompanying drawings, like reference numerals are used for description of like or equivalent parts or portions for simplicity of illustration and explanation, detailed description of which will be omitted.

Now, without any intention of putting a limitation to preferred embodiments or the scope of the present invention, a description will be made about an internal clock generating circuit and method for generating an internal clock time-delayed by a predetermined level of phase to an external clock.

Figure 2A:
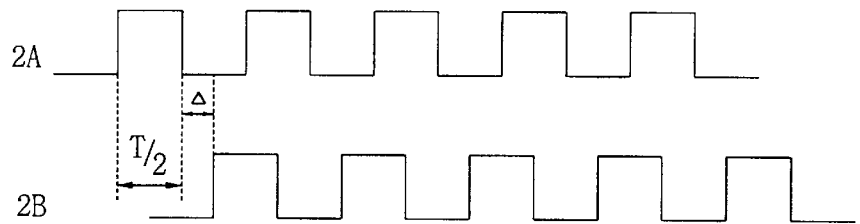
FIGS. 2*a* and 2*c* are diagrams showing the time delay of an internal clock phase-synchronized to an external clock phase at an initial state and in a phase-locked state, generated by an internal clock generating circuit according to an embodiment of the present invention, respectively.
Figure 2B:
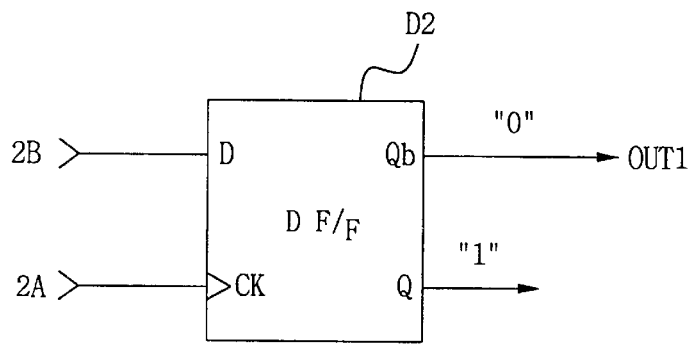
FIGS. 2*b* and 2*d* are diagrams showing a phase detector for detecting the time delay of FIGS. 2*a* and 2*c*, respectively.
Figure 2C:
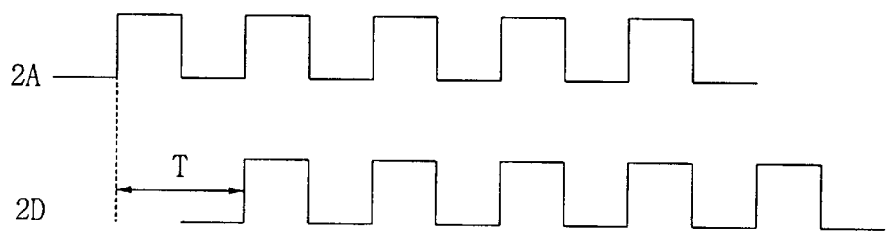
Figure 2D:
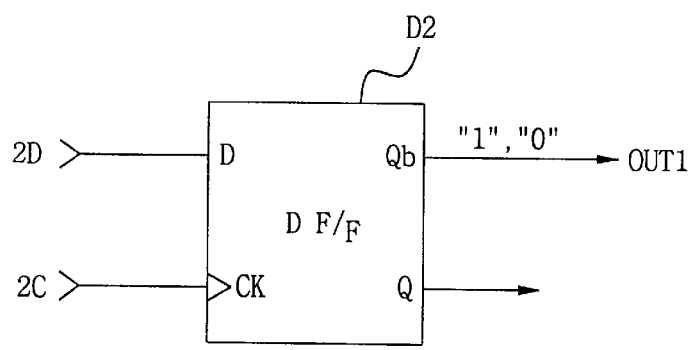

FIGS. 2*a* and 2*c* show the time delay of an internal clock phase-synchronized to an external clock phase at an initial state and in a phase-locked state, generated by an internal clock generating circuit according to an embodiment of the present invention, respectively. FIGS. 2*b* and 2*d* show a phase detector for detecting the time delay of FIGS. 2*a* and 2*c*, respectively. In preferred embodiments of the present invention, the time delay of a dual DDL is set greater than T/2 (T/2+Δ) at an initial state (as shown in FIG. 2*a*), and the total time delay of the dual DDL is controlled to have about one cycle T of an external clock in a phase-locked state, i.e., a normal state (as shown in FIG. 2*c*).

FIG. 2*a* shows two clock signals applied to a phase comparison unit of a dual DLL in an internal clock generating circuit at an initial state. A clock (2A) is an input clock (e.g., an external clock), and a clock (2B) is an internal clock generated from the dual DLL after the input clock passed through variable delay lines of the DLL. If the two clocks (2A and 2B) are applied to a phase detector D2 comprising a D-flip flop at the initial state, the phase detector D2 outputs a low logic value "0" to an output line (OUT1) through an output terminal (Qb). Note that (Qb) is the inverse of output Q. The logic value "0" is a signal for increasing the time delays of the variable delay lines such that the phase of the clock (2B) is gradually shifted to the rear of a time axis. In other words, while the logic level "0" is maintained in the DLL, a phase delay between the clocks (2A and 2B) becomes larger.

When the time delay between the two clocks becomes an amount of a cycle (T) of the input clock (2A), i.e., the phase of the clock (2B) becomes the phase of a clock (2D), the phase detector D2 outputs a high logic value "1" to the output line (OUT1) through the output terminal (Qb) as shown in FIGS. 2*c* and 2*d*. The logic value "1" is a signal for reducing the time delays of the variable delay lines of the DLL. Therefore, if the time delay between the clocks (2A and 2B) is shorter than the cycle (T) of the external clock (2A), a low logic value "0" is output to the output line (OUT1). When the time delay between two clocks reaches the cycle (T) with the increase of the time delay, the low logic value "0" becomes a high logic value "1" and the DLL circuit is locked, i.e., a normal state.

As described above, a locking operation of a dual DLL in an internal clock generating circuit according to the invention is performed when the phase difference between an input clock (e.g., an external clock) and an internal clock has one cycle (T) of the input clock. At this time, the total time delay of the DLL (which comprises variable delay lines) corresponds to the cycle (T) of the input clock. Thus, advantageously, an internal clock generating circuit of the invention does not require additional delay line for generating an internal clock phase-synchronized to an external clock.

A dual DLL in an internal clock generating circuit according to a preferred embodiment of the present invention comprises a DLL for setting time delay as greater than T/2 (T/2+Δ) at an initial state to generate an internal clock phase-synchronized to an input clock (e.g., an external clock).

Figure 3:
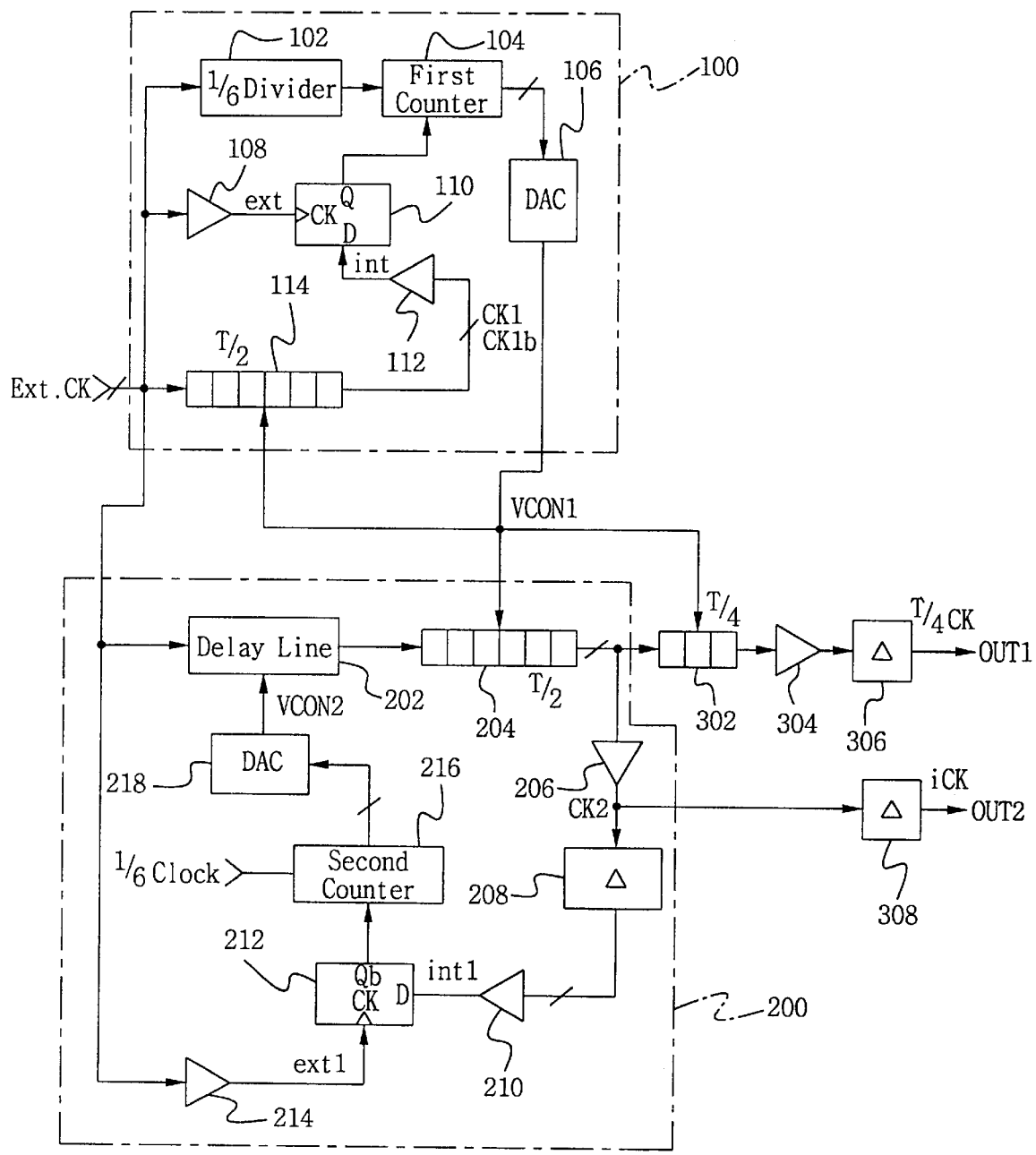
FIG. 3 is a block diagram illustrating an internal clock generating circuit comprising a dual DDL according to an embodiment of the present invention.
Figure 4:
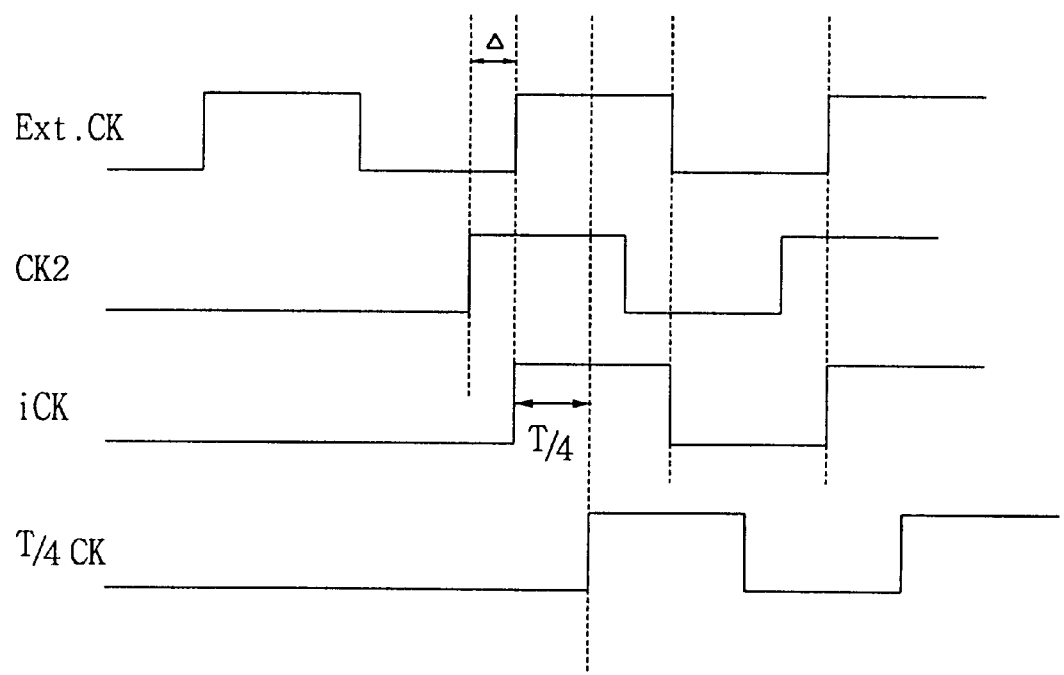
FIG. 4 is a diagram illustrating the clock waveforms generated by an internal clock generating circuit of FIG. 3

FIG. 3 is a block diagram for illustrating an internal clock generating circuit comprising a dual DLL in accordance with a preferred embodiment of the present invention. FIG. 4 is a diagram illustrating clock the waveforms generated by an internal clock generating circuit of FIG. 3.

Referring to FIG. 3, an internal clock generating circuit according to the invention comprises a digitally controlled DLL having time delay of greater than T/2 at an initial state to generates an internal clock phase-synchronized to an input clock with minimum delay and at high speed. The digital-controlled DLL comprises first and second delay control circuits 100, 200. The first delay control circuit 100 generates a first clock (CK1) and a variable delay control signal (VCON1). The first clock (CK1) comprises time delay of up to T/2 (in which T indicates a cycle of the input clock) from the input clock (Ext. CK). The second delay control circuit 200 generates a second clock (iCK) as an internal clock. The second clock (iCK) has time delay of greater than T/2 from the input clock at the initial state and has time delay of about T from the input clock in a phase-locked state, in response to the variable delay control signal (VCON1) of the first delay control circuit 100.

For instance, the first delay control circuit 100 comprises a divider 102 for dividing the input clock (e.g., external clocks, Ext. CK); a first buffer 108 for controlling a level of the input clock to a predetermined internal level; a first variable delay line 114 for delaying a phase of the input clock in response to the first variable delay control signal (VCON1); a second buffer 112 for controlling a level of an output signal of the first variable delay line 112 to the predetermined internal level; a first phase comparison unit 110 for latching an output signal of the second buffer 112 according to the output signal of the first buffer 108 and for outputting a first up/down counting control signal; a first counter 104 for counting an output signal of the divider 102 and for outputting a first digital up/down counting data in response to the first up/down counting control signal of the first phase comparison unit 110; and a first digital to analog converter (DAC) 106 for converting the first digital up/down counting data into a first digital signal to generate the first variable delay control signal (VCON1).

On the other hand, the second delay control circuit 200 comprises a third buffer 214 for controlling a level of the input clock to a predetermined internal level; a second variable delay line 202 for delaying a phase of the input clock in response to a second variable delay control signal (VCON2); a third variable delay line 204 (which has a similar structure with the first variable delay line 114) for delaying a phase of an output signal of the second variable delay line 202 in response to the first variable delay control signal (VCON1); a fourth buffer 206 for controlling a level of an output signal of the third variable delay line 204 to the predetermined internal level; a first driver 208 for driving an output signal of the fourth buffer 206; a fifth buffer 210 for controlling a level of an output signal of the first driver 208 to the predetermined internal level; a second phase comparison unit 212 for latching an output signal of the fifth buffer 210 according to an output signal of the third buffer 214 and for outputting a second up/down counting control signal; a second counter 216 for counting the output signal of the divider 102 and for outputting a second digital up/down counting data in response to the second up/down counting control signal; and a second digital to analog converter (DAC) 218 for converting the second digital up/down counting data into a second digital signal to generate the second variable delay control signal (VCON2).

An internal clock generating circuit of FIG. 3 further comprises a quarter variable delay line 302, a sixth buffer 304 and a second driver 306, sequentially connected to the second delay control circuit 200, for generating an T/4 delayed internal clock (T/4 CK) from the input clock. In other words, as shown in FIG. 4, an output terminal (OUT1) of the second driver 306 outputs a clock signal (T/4 CK), shifted by 90 degrees from the input clock (Ext. CK). The internal clock (iCK) of the second delay control circuit 200 is output to an output terminal (OUT2) through a third driver 308 (which has the same time delay as that of the first driver 208). The output signal (iCK) is a T-delayed clock from the input clock (Ext. CK) in a phase-locked state. In other words, as shown in FIG. 4, the T-delayed clock signal (iCK) is an internal clock precisely phase-synchronized to the input clock (Ext. CK).

Referring to FIGS. 3 and 4 again, when an input clock (Ext. CK) is applied to an internal clock generating circuit, the clock (Ext. CK) is commonly applied to a divider 102, a first buffer 108, a first variable delay line 114 of a first delay control circuit 100 and a third buffer 214 and a second variable delay line 202 of a second delay control circuit 200. For instance, at an initial state of an internal clock generating circuit of FIG. 3, the first variable delay line 114 delays the input clock (Ext. CK) by an amount of a unit. In this case, because the first variable delay line 114 comprises six units, the amount of time delay is T/12. Accordingly, a phase delay between the output signal (ext) of the first buffer 108 and the output signal (int) of a second buffer 112 corresponds to an amount of the unit of the first variable delay line 114.

Figure 1C:
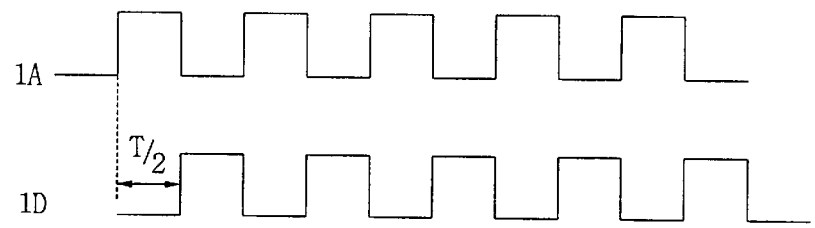
Figure 1D:
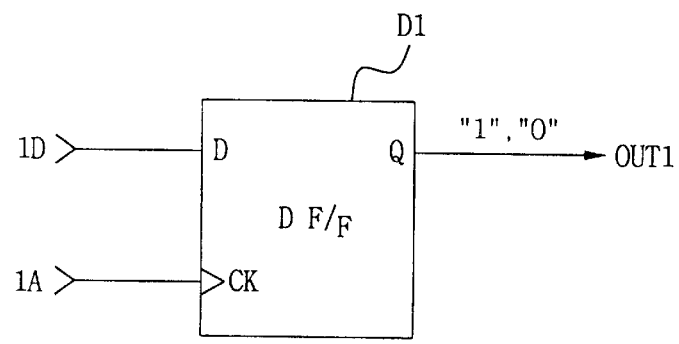

When a first phase comparison unit 110 receives the output signal (ext) of the first buffer 108 and the output signal (int) of the second buffer 112 at a clock terminal CK and a data input terminal D (as shown in FIG. 2b), respectively, the first phase comparison unit 110 outputs a logic value "0" to the output terminal (Q). According to the logic value "0", a first counter 104 performs an "up counting" operation and then outputs, for example, an 8-bit digital signal. The digital signal is applied to a first DAC 106, and the first DAC 106 outputs a first analog voltage signal as a first variable delay control signal (VCON1). The first variable delay line 114 delays the input clock (Ext. CK) by 2 units (in this case, T/6). When the first variable delay line 114 delays the input clock by 6 units (in this case, T/2) through the repeating of the above operations, the time delay between the signals (ext and int) becomes T/2 (like to the time delay in FIG. 1c). At this time, the first phase comparison unit 110 of the first delay control circuit 100 outputs a logic value "1" (like to the output "1" in FIG. 1*d*), so that the dual DLL in the internal clock generating circuit becomes a phase-locked state.

On the other hand, a third variable delay line 204 of a second delay control circuit 200 has the same time delay as the first variable delay line 114 of the first delay control circuit 100, and is controlled by the first variable delay control signal (VCON1). When there is no time delay by a second variable delay line 202, an output signal (CK2) of a forth buffer 206 has the time delay of T/2 or greater than the input clock (Ext. CK). Thus, the second delay control circuit 200 has the time delay of grater than T/2 (T/2+Δ) (as shown in FIG. 2*a*) at an initial state.

Because the second variable delay line 202 is still at the initial state, it can delay the phase of the input clock (Ext. CK) by a unit (e.g., T/12) instead of T/2. Thus, the phase delay between the output signal (ext1) of a third buffer 214 and the output signal (int1) of a fifth buffer 210 corresponds to an amount of the unit. When a second phase comparison unit 212 receives the output signal (ext1) of the third buffer and the output signal (int1) of the fifth buffer at a clock terminal CK and a data input terminal D, respectively, the unit 212 outputs a logic value "0" to the output terminal (Qb). According to the output "0", a second counter 216 performs an "up counting" operation and then outputs, for example, an 8-bit digital signal. The digital signal is applied to a second DAC 218, and the second DAC 218 outputs a second analog voltage signal as a second variable delay control signal (VCON2). The second variable delay line 202 delays the input clock by 2 units (e.g., T/6). The second variable delay line 202 continuously delays the input clock by the 2 units until the delay time between the signals (ext1 and int1) becomes one cycle T of an input clock (like to the time delay in FIG. 2*c*). At this time, the second phase comparison unit 212 of the second delay control circuit 200 outputs a logic value "1" (like to the output in FIG. 2*d*), and the DLL enters a phase-locked state.

As a result, when the sum of the time delays of the forth buffer 206 and a third driver 308 and the time delay of the second variable delay line 202 is the time delay of T/2, the third driver 308 outputs an internal clock (iCK) phase-synchronized to the input clock (Ext. CK) to an output line (OUT2). The internal clock (iCK) is time-delayed exactly by one cycle from the input clock (Ext. CK). On the other hand, a second driver 306 outputs a clock (T/4 CK) to an output line (OUT1) through a quarter delay 302 and a six buffer 304. The clock (T/4 CK), as shown in FIG. 4, is shifted by 90 degrees from the phase of the input clock (iCK).

An internal clock generating circuit of FIG. 3 comprises a ⅙ divider 102 to properly control phase lock timing and reduce power consumption. However, it should be understood that a divider could be removed or the frequency division rate of the divider could be increased depending on a certain condition. Further, even if a variable delay line has six analog delay line levels in a preferred embodiment of the present invention, it may be possible to make various changes and modifications of the variable delay lines. An amount of time delay of drivers 306, 308 in a preferred embodiment of the present invention should correspond to the time delay of Δ as shown in FIG. 4.

Advantageously, because an internal clock generating circuit according to a preferred embodiment of the present invention comprises a dual DLL for generating a second clock (which has the time delay of greater than T/2 from an input clock at an initial state and has the time delay of about T from the input clock in a phase-locked state) as an internal clock, an internal clock synchronized to the input clock and a clock phase-delayed at 90 degrees from the input clock can be generated in the internal clock generating circuit with a minimum variable delay line and in a short period time. Further, data can be accurately sampled in a semiconductor memory device having a skew between an external clock and input data.

While the invention has been described only in terms of the preferred embodiment with reference to the accompanying drawings, those skilled in the art will recognized that the invention can be practiced with various changes and modifications within the spirit and scope of the appended claims. For instance, the aforementioned elements can be substituted with other equivalent or logic elements.

What is claimed is:

1. An internal clock generating circuit comprising:
    a first delay control circuit for generating a first clock having the time delay of up to T/2 (where T is a cycle of an input clock) from the input clock and for generating a first variable delay control signal; and
    a second delay control circuit for generating a second clock in response to the first variable delay control signal, the second clock having the time delay of greater than T/2 from the input clock at an initial state and having the time delay of about T from the input clock in a phase-locked state.

2. The circuit of claim 1, wherein the input clock is an external clock.

3. The circuit of claim 1, wherein the first delay control circuit comprises:
    a first variable delay line for delaying a phase of the input clock to generate the first clock in response to the first variable delay control signal;
    a first phase comparison unit for comparing the first clock with the input clock to generate a first up/down counting control signal; and
    a first counter for counting the input clock to generate the first variable delay control signal in response to the first up/down counting control signal,
    wherein the first variable delay line delays the phase of the input clock until the first clock has the time delay of up to T/2 from the input clock.

4. The circuit of claim 3, wherein the first delay control circuit further comprises:
    a divider for dividing the input clock and for outputting the divided input clock to the first counter;
    a first buffer for controlling a level of the input clock to a predetermined internal level and for outputting the controlled input clock to the first phase comparison unit;
    a second buffer for controlling a level of the first clock output from the first variable delay line to the predetermined internal level and for outputting the controlled first clock to the first phase comparison unit; and
    a first digital to analog converter for converting the output of the first counter into a first digital signal to generate the first variable delay control signal.

5. The circuit of claim 1, wherein the second delay control circuit comprises:
    a second variable delay line for delaying a phase of the input clock in response to a second variable delay control signal;
    a third variable delay line for delaying the output of the second variable delay line to generate the second clock in response to the first variable delay control signal;

a second phase comparison unit for comparing the second clock with the input clock to generate a second up/down counting control signal; and a second counter for counting the input clock to generate the second variable delay control signal in response to the second up/down counting control signal, wherein the second and third variable delay lines delay the input clock until the second clock has the time delay of greater than T/2 from the input clock at the initial state and the time delay of about T from the input clock in the phase-locked state.

6. The circuit of claim 5, wherein the second delay control circuit further comprises:

a third buffer for controlling a level of the input clock to a predetermined internal and for outputting the controlled input clock to the second phase comparison unit;

a fourth buffer for controlling a level of the second clock output from the third variable delay line to the predetermined internal value;

a first driver for driving an output signal of the fourth buffer;

a fifth buffer for controlling a level of an output signal of the first driver to the predetermined internal value and for outputting the controlled input clock to the second phase comparison circuit;

a second digital to analog converter for converting an output signal of the second counter into a second digital signal to generate the second variable delay control signal; and a second driver for driving the second clock to outside.

7. The circuit of claim 3, wherein the first delay control circuit comprises delay locked loops.

8. The circuit of claim 5, wherein the second delay control circuit comprises delay locked loops.

9. The circuit of claim 5, wherein the second delay control circuit further comprises:

a quarter variable delay line for delaying the second clock;

a sixth buffer for controlling a level of an output signal of the quarter variable delay line to a predetermined internal level; and a third driver for outputting a third clock, wherein the third clock is shift by 90 degrees from the second clock.

10. The circuit of claim 5, wherein the third variable delay line of the second delay control circuit comprises the same time delay as the first delay control circuit.

11. A method for generating an internal clock comprising the steps of:

generating a first internal clock having the time delay of up to T/2 (where T is a cycle of an input clock) from the input clock;

generating a variable delay control signal in response to the first internal clock and the input clock; and generating a second internal clock in response to the variable delay control signal, wherein the second internal clock has the time delay of greater than T/2 from the input clock at an initial state and has the time delay of about T from the input clock in a phase-locked state.

12. The method of claim 11, wherein the step of generating the first internal clock comprises the steps of:

comparing the first internal clock with the input clock to determine the time delay between the first internal clock and the input clock; and delaying the first internal clock until the first internal clock has the time delay of up to T/2 from the input clock when the time delay between the first internal clock and the input clock is less than T/2.

13. The method of claim 11, wherein the step of generating the second internal clock comprises the steps of:

comparing the second internal clock with the input clock to determine the time delay between the second internal clock and the input clock; and delaying the second internal clock until the second internal clock has the time delay of greater than T/2 from the input clock at the initial state when the time delay between the second internal clock and the input clock is or less than T/2 at the initial state.

14. The method of claim 11, further comprising the steps of:

generating a third internal clock in response to the second internal clock, the third internal clock being shifted 90 degrees from the second internal clock.

15. A method for generating an internal clock comprising the steps of:

comparing a first internal clock with an input clock (where T is a cycle of the input clock) to determine a time delay between the first internal clock and the input clock;

delaying the first internal clock until the first internal clock has the time delay of up to T/2 from the input clock when the time delay between the first internal clock and the input clock is less than T/2; and generating a second internal clock in response to the first internal clock, wherein the second internal clock has the time delay of greater than T/2 from the input clock at an initial state and has the time delay of about T from the input clock in a phase-locked state.

* * * * *